United States Patent
Ahn et al.

(10) Patent No.: US 9,633,779 B2
(45) Date of Patent: Apr. 25, 2017

(54) COMPOSITE ELECTRONIC COMPONENT AND BOARD HAVING THE SAME

(71) Applicant: SAMSUNG ELECTRO-MECHANICS CO., LTD., Suwon-si, Gyeonggi-Do (KR)

(72) Inventors: Young Ghyu Ahn, Suwon-Si (KR); Byoung Hwa Lee, Suwon-Si (KR); Sang Soo Park, Suwon-Si (KR); Min Cheol Park, Suwon-Si (KR)

(73) Assignee: SAMSUNG ELECTRO-MECHANICS CO., LTD., Suwon-si, Gyeonggi-do (KR)

( * ) Notice: Subject to any disclaimer, the term of this patent is extended or adjusted under 35 U.S.C. 154(b) by 312 days.

(21) Appl. No.: 14/456,674

(22) Filed: Aug. 11, 2014

(65) Prior Publication Data
US 2015/0043185 A1  Feb. 12, 2015

(30) Foreign Application Priority Data
Aug. 9, 2013  (KR) ........................ 10-2013-0094692

(51) Int. Cl.
| | |
|---|---|
| H01G 4/30 | (2006.01) |
| H01G 4/005 | (2006.01) |
| H01G 4/228 | (2006.01) |
| H01F 29/00 | (2006.01) |
| H03H 7/01 | (2006.01) |
| H01G 4/01 | (2006.01) |
| H05K 1/11 | (2006.01) |
| H01G 4/40 | (2006.01) |

(Continued)

(52) U.S. Cl.
CPC ......... *H01F 29/00* (2013.01); *H01F 27/2804* (2013.01); *H01F 27/292* (2013.01);
(Continued)

(58) Field of Classification Search
CPC ......... H03H 2001/0014; H03H 7/0115; H03H 2001/0092; H03H 2001/0085; H01G 4/30; H01G 4/01; H01G 4/005; H01G 4/002; H01G 4/232; H01G 4/228; H01G 4/12; H01G 4/1209
(Continued)

(56) References Cited

U.S. PATENT DOCUMENTS

| | | | |
|---|---|---|---|
| 5,610,565 A * | 3/1997 | Maeda ................. | H03H 1/0007 333/181 |
| 2003/0030510 A1* | 2/2003 | Sasaki ................. | H03H 7/0115 333/185 |
| 2015/0041202 A1* | 2/2015 | Ahn ....................... | H01G 17/00 174/260 |

FOREIGN PATENT DOCUMENTS

KR   2003-0014586 A   2/2003

* cited by examiner

*Primary Examiner* — Binh Tran
(74) *Attorney, Agent, or Firm* — McDermott Will & Emery LLP

(57) ABSTRACT

A composite electronic component may include: a composite body including a capacitor and an inductor coupled to each other, the capacitor having a ceramic body in which dielectric layers and internal electrodes facing each other with the dielectric layers interposed therebetween are stacked, and the inductor having a magnetic body in which magnetic layers having conductive patterns are stacked; an input terminal disposed on a first end surface of the composite body; an output terminal including a first output terminal disposed on a second end surface of the composite body and a second output terminal disposed on any one or more of upper and lower surfaces and a second side surface of the capacitor; and a ground terminal disposed on any one or more of the upper and lower surfaces and a first side surface of the capacitor and connected to the internal electrodes.

18 Claims, 8 Drawing Sheets

(51) Int. Cl.
*H01G 4/012* (2006.01)
*H01G 4/232* (2006.01)
*H01F 27/28* (2006.01)
*H01F 27/29* (2006.01)
*H01F 27/40* (2006.01)
H01G 2/20 (2006.01)
H01G 4/06 (2006.01)
H03H 7/00 (2006.01)
H01G 4/12 (2006.01)

(52) U.S. Cl.
CPC ............. *H01F 27/40* (2013.01); *H01G 4/005* (2013.01); *H01G 4/01* (2013.01); *H01G 4/012* (2013.01); *H01G 4/1209* (2013.01); *H01G 4/228* (2013.01); *H01G 4/232* (2013.01); *H01G 4/30* (2013.01); *H01G 4/40* (2013.01); *H03H 7/0115* (2013.01); *H05K 1/111* (2013.01); *H01F 2027/2809* (2013.01); *H01G 4/12* (2013.01); *H05K 2201/1003* (2013.01); *H05K 2201/10015* (2013.01); *H05K 2201/10045* (2013.01); *Y02P 70/611* (2015.11)

(58) Field of Classification Search
USPC ... 361/821, 301.4, 303, 306.3, 308.1, 321.2; 333/181, 185
See application file for complete search history.

COMPOSITE ELECTRONIC COMPONENT AND BOARD HAVING THE SAME

CROSS-REFERENCE TO RELATED APPLICATION

This application claims the benefit of Korean Patent Application No. 10-2013-0094692 filed on Aug. 9, 2013, with the Korean Intellectual Property Office, the disclosure of which is incorporated herein by reference.

BACKGROUND

The present disclosure relates to a composite electronic component including a plurality of passive elements and a board having the same.

In accordance with the recent trend for slimness, lightness and high levels of performance in electronic devices, the miniaturization and multifunctionalization of electronic components included in such electronic devices have been required.

Electronic devices, as described above, commonly include power semiconductor-based power management integrated circuits (PMICs), such PMICs serving to efficiently control and manage limited battery resources, in order to satisfy various service requirements.

However, as electronic devices are multi-functionalized, the number of direct current (DC)/DC converters included in PMICs has increased, and the number of passive elements included in a power input terminal and a power output terminal of the PMIC has also increased.

In this regard, since a component arrangement area of the electronic device may inevitably be increased, there may be limitations on the miniaturization of electronic devices.

In addition, significant amounts of noise may be generated by wiring patterns in the PMIC and peripheral circuits of the PMIC.

RELATED ART DOCUMENT (Patent Document 1) Korean Patent Laid-Open Publication No. 2003-0014586

SUMMARY

An exemplary embodiment in the present disclosure may provide a composite electronic component having a reduced component mounting area in a driving power supplying system, and a board having the same.

An exemplary embodiment in the present disclosure may also provide a composite electronic component capable of suppressing the generation of noise in a driving power supplying system, and a board having the same.

According to an exemplary embodiment in the present disclosure, a composite electronic component may include: a composite body having a hexahedral shape and including a capacitor and an inductor which are coupled to each other, the capacitor having a ceramic body in which a plurality of dielectric layers and internal electrodes disposed to face each other with at least one of the dielectric layers interposed therebetween are stacked, and the inductor having a magnetic body in which a plurality of magnetic layers having conductive patterns are stacked; an input terminal disposed on a first end surface of the composite body and connected to the conductive pattern of the inductor; an output terminal including a first output terminal disposed on a second end surface of the composite body and connected to the conductive pattern of the inductor and a second output terminal disposed on any one or more of upper and lower surfaces and a second side surface of the capacitor; and a ground terminal disposed on any one or more of the upper and lower surfaces and a first side surface of the capacitor and connected to the internal electrodes of the capacitor.

The internal electrodes may include first internal electrodes each having a lead exposed to a first side surface of the composite body and second internal electrodes each having a lead exposed to the second side surface of the composite body.

The inductor may be disposed on the capacitor.

The capacitor and the inductor may be coupled to each other by a conductive adhesive.

According to an exemplary embodiment in the present disclosure, a composite electronic component may include: a composite body having a hexahedral shape and including a capacitor and an inductor which are coupled to each other, the capacitor having a ceramic body in which a plurality of dielectric layers and first and second internal electrodes disposed to face each other with at least one of the dielectric layers interposed therebetween are stacked, each first internal electrode having a lead exposed to a first side surface of the ceramic body and each second internal electrode having a lead exposed to a second side surface of the ceramic body, and the inductor having a magnetic body in which a plurality of magnetic layers having conductive patterns are stacked; a first external electrode disposed on the first side surface of the ceramic body and electrically connected to the first internal electrodes; a second external electrode disposed on the second side surface of the ceramic body and electrically connected to the second internal electrodes; first and second dummy electrodes disposed on first and second end surfaces of the ceramic body; and third and fourth external electrodes disposed on first and second end surfaces of the magnetic body and connected to the conductive patterns, wherein the composite body includes an input terminal having the first dummy electrode and the third external electrode which are connected to each other, an output terminal including a first output terminal having the second dummy electrode and the fourth external electrode which are connected to each other and a second output terminal having the second external electrode, and a ground terminal having the first external electrode.

The inductor may be disposed on the capacitor.

The capacitor and the inductor may be coupled to each other by a conductive adhesive.

According to an exemplary embodiment in the present disclosure, a composite electronic component may include: an input terminal receiving power converted by a power management unit; a power stabilization unit stabilizing the power and including a composite body having a hexahedral shape and including a capacitor and an inductor which are coupled to each other, the capacitor having a ceramic body in which a plurality of dielectric layers and internal electrodes disposed to face each other with at least one of the dielectric layers interposed therebetween are stacked, and the inductor having a magnetic body in which a plurality of magnetic layers having conductive patterns are stacked; an output terminal supplying the stabilized power; and a ground terminal for grounding.

The input terminal may be disposed on a first end surface of the composite body, the output terminal may include a first output terminal disposed on a second end surface of the composite body and a second output terminal disposed on a second side surface of the composite body, and is connected to the conductive patterns of the inductor and the internal electrodes of the capacitor, and the ground terminal may be disposed on a lower surface and a first side surface of the composite body and connected to the internal electrodes of the capacitor.

The internal electrodes may include first internal electrodes each having a lead exposed to a first side surface of the composite body and second internal electrodes each having a lead exposed to a second side surface of the composite body.

The input terminal may have a first dummy electrode disposed on a first end surface of the ceramic body and a third external electrode disposed on a first end surface of the magnetic body and connected to the conductive pattern, the first dummy electrode and the third external electrode being connected to each other, the output terminal may include a first output terminal having a second dummy electrode disposed on a second end surface of the ceramic body and a fourth external electrode disposed on a second end surface of the magnetic body and connected to the conductive pattern, the second dummy electrode and the fourth external electrode being connected to each other, and a second output terminal having a second external electrode disposed on a second side surface of the ceramic body and electrically connected to the second internal electrodes, and the ground terminal may have a first external electrode disposed on a first side surface of the ceramic body and electrically connected to the first internal electrodes.

The inductor may be a winding inductor or a thin film inductor.

According to an exemplary embodiment in the present disclosure, a board having a composite electronic component may include: a printed circuit board on which three or more electrode pads are provided; the composite electronic component as described above, mounted on the printed circuit board; and solders connecting the electrode pads and the composite electronic component to each other.

The electrode pads may include a first electrode pad connected to the input terminal of the composite electronic component, a second electrode pad connected to the first and second output terminals of the composite electronic component, and a third electrode pad connected to the ground terminal of the composite electronic component.

The electrode pads may include a first electrode pad connected to the input terminal of the composite electronic component, a second electrode pad connected to the first output terminal of the composite electronic component, a third electrode pad connected to the second output terminal of the composite electronic component, and a fourth electrode pad connected to the ground terminal of the composite electronic component.

The second and third electrode pads may be connected to each other through a via.

The inductor may be a winding inductor or a thin film inductor.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
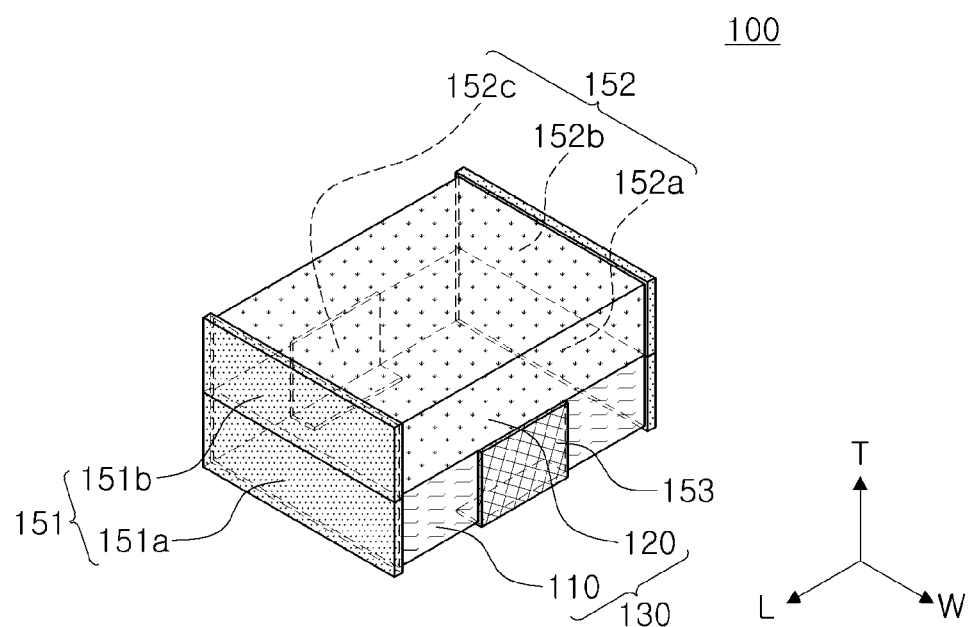
FIG. 1 is a perspective view schematically illustrating a composite electronic component according to an exemplary embodiment in the present disclosure.

Exemplary embodiments of the present disclosure will now be described in detail with reference to the accompanying drawings.

The disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

Composite Electronic Component

FIG. 1 is a perspective view schematically illustrating a composite electronic component according to an exemplary embodiment of the present disclosure.

Figure 2:
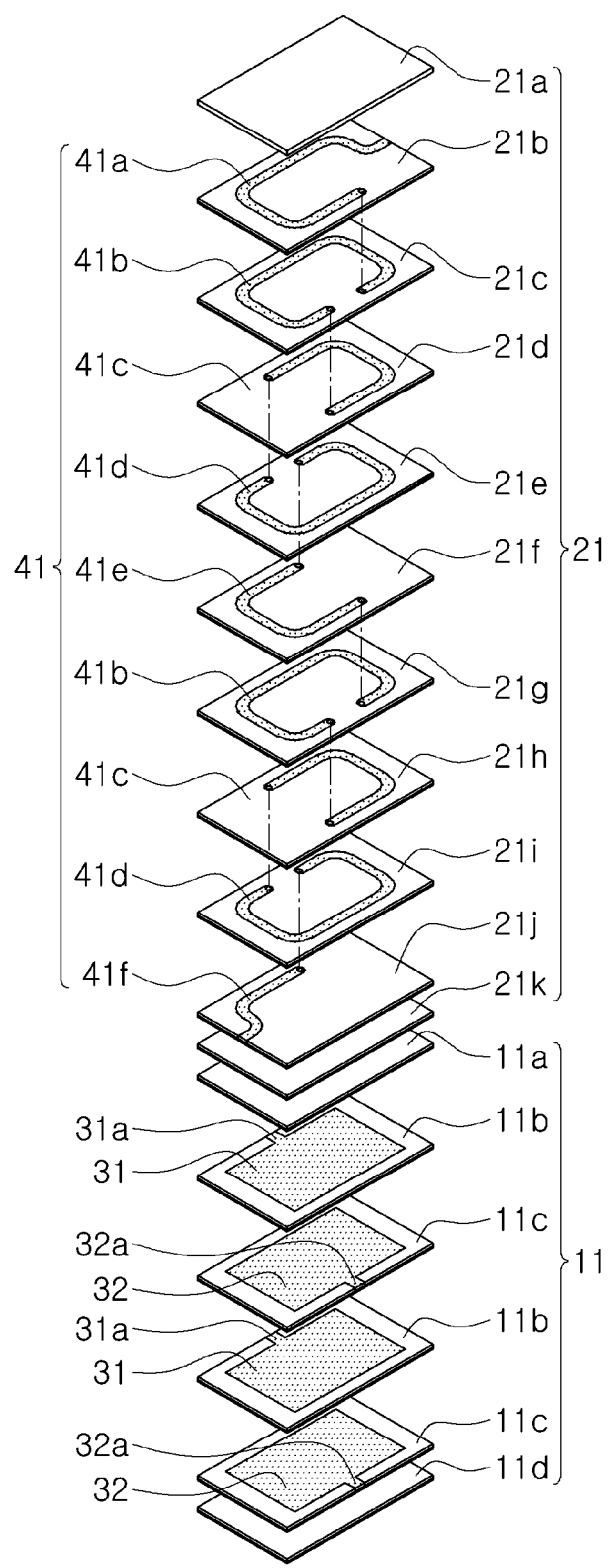
FIG. 2 is an exploded perspective view schematically illustrating a stacked state in the composite electronic component of FIG. 1.

FIG. 2 is an exploded perspective view schematically illustrating a stacked state in the composite electronic component of FIG. 1.

Figure 3:
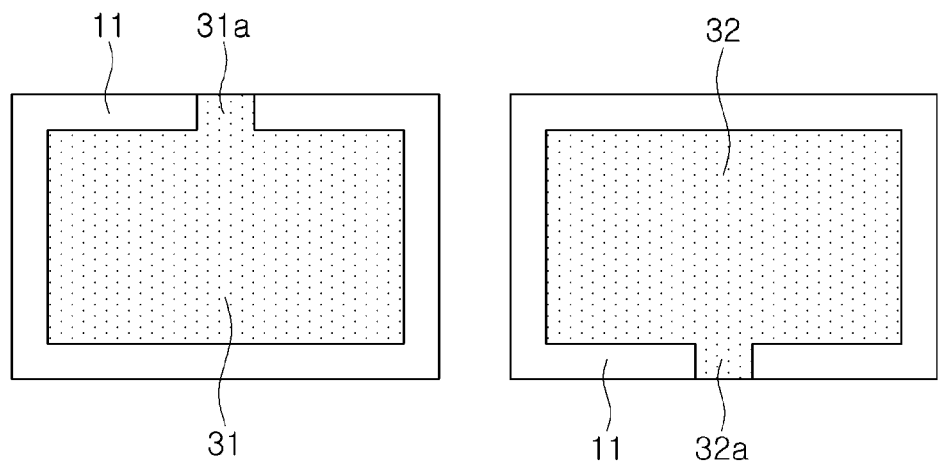
FIG. 3 is a plan view illustrating internal electrodes applicable to a multilayer ceramic capacitor in the composite electronic component of FIG. 1.

FIG. 3 is a plan view illustrating internal electrodes applicable to a multilayer ceramic capacitor in the composite electronic component of FIG. 1.

Referring to FIG. 1, in the composite electronic component according to the exemplary embodiment of the present disclosure, an 'L' direction of FIG. 1 refers to a 'length direction,' a 'W' direction of FIG. 1 refers to a 'width direction,' and a 'T' direction of FIG. 1 refers to a 'thickness direction'. Here, the 'thickness direction' may be the same as a direction in which dielectric layers of the capacitor are stacked, that is, a 'stacking direction'.

Meanwhile, the length, width, and thickness directions of the composite electronic component may be the same as those of a capacitor and an inductor, respectively, as described below.

In addition, in the present exemplary embodiment, the composite electronic component may have upper and lower surfaces opposing each other, and first and second side surfaces and first and second end surfaces that connect the upper and lower surfaces to each other. A shape of the composite electronic component is not particularly limited, but may be hexahedral as illustrated.

Further, the first and second side surfaces and the first and second end surfaces of the composite electronic component may be disposed in the same directions as directions of first and second side surfaces and first and second end surfaces of the capacitor and the inductor, respectively, as described below.

Meanwhile, the composite electronic component has a form in which the capacitor and the inductor are coupled to each other, and in the case in which the inductor is disposed on the capacitor, the upper surface of the composite electronic component may be an upper surface of the inductor, and the lower surface of the composite electronic component may be a lower surface of the capacitor.

Further, the first and second side surfaces may correspond to surfaces of the composite electronic component opposing each other in the width direction, the first and second end surfaces may correspond to surfaces of the composite electronic component opposing each other in the length direction, and the upper and lower surfaces may correspond to surfaces of the composite electronic component opposing each other in the thickness direction.

Referring to FIGS. 1 through 3, the composite electronic component 100 according to the exemplary embodiment of the present disclosure may include a composite body 130 having an overall hexahedral shape and including a capacitor 110 and an inductor 120 which are coupled to each other, wherein the capacitor 110 is formed of a ceramic body in which a plurality of dielectric layers 11 and internal electrodes 31 and 32 disposed to face each other with at least one of the dielectric layers 11 interposed therebetween are stacked, and the inductor 120 is formed of a magnetic body in which a plurality of magnetic layers 21 having conductive patterns 41 are stacked.

In the present exemplary embodiment, the composite body 130 having the hexahedral shape may have upper and lower surfaces opposing each other, and first and second side surfaces and first and second end surfaces that connect the upper and lower surfaces to each other.

A shape of the composite body 130 is not particularly limited, but may be hexahedral as illustrated.

The composite body 130 having the hexahedral shape may be formed by coupling the capacitor 110 and the inductor 120, and a method of forming the composite body 130 is not particularly limited.

For example, the composite body 130 may be formed by coupling the capacitor 110 and the inductor 120 that are separately manufactured using a conductive adhesive, a resin, or the like, or may be formed by sequentially stacking the ceramic body configuring the capacitor 110 and the magnetic body configuring the inductor 120, but is not limited thereto.

Meanwhile, according to the exemplary embodiment of the present disclosure, the inductor 120 may be disposed on the capacitor 110, but is not limited thereto. That is, the disposition of the inductor may be varied.

Hereinafter, the capacitor 110 and the inductor 120 configuring the composite body 130 will be described in detail.

Referring to FIG. 2, the ceramic body configuring the capacitor 110 may be formed by stacking a plurality of dielectric layers 11a to 11d, and a plurality of internal electrodes 31 and 32 (sequentially first and second internal electrodes) may be separately disposed in the ceramic body with respective dielectric layers interposed therebetween.

The plurality of dielectric layers 11 configuring the ceramic body may be in a sintered state and adjacent dielectric layers may be integrated with each other, such that boundaries therebetween are not readily apparent.

The dielectric layers 11 may be formed by sintering ceramic green sheets containing a ceramic powder, an organic solvent, and an organic binder. The ceramic powder may be a material having high permittivity and may contain, but is not limited to, a barium titanate ($BaTiO_3$)-based material, a strontium titanate ($SrTiO_3$)-based material, or the like.

Meanwhile, according to the exemplary embodiment of the present disclosure, the internal electrodes may include the first internal electrodes 31 each having a lead 31a exposed to the first side surface of the composite body 130, and the second internal electrodes 32 each having a lead 32a exposed to the second side surface thereof, but are not limited thereto.

More specifically, the ceramic body configuring the capacitor 110 may be formed by stacking the plurality of dielectric layers 11a to 11d.

The first and second internal electrodes 31 and 32 may be formed on some dielectric layers 11b and 11c of the plurality dielectric layers 11a to 11d and stacked.

According to the exemplary embodiment of the present disclosure, the first and second internal electrodes 31 and 32 may be formed of a conductive paste containing a conductive metal.

The conductive metal may be nickel (Ni), copper (Cu), palladium (Pd), or alloys thereof, but is not limited thereto.

The first and second internal electrodes 31 and 32 may be printed on the ceramic green sheets forming the dielectric layers 11 using the conductive paste by a printing method such as a screen printing method or a gravure printing method.

The ceramic green sheets having the internal electrodes printed thereon may be alternately stacked and sintered, thereby forming the ceramic body.

Although pattern shapes of the first and second internal electrodes 31 and 32 are illustrated in FIG. 3, the pattern shapes are not limited thereto and may be varied.

The capacitor may serve to adjust a voltage supplied from a power management integrated circuit (PMIC).

According to the exemplary embodiment of the present disclosure, in the magnetic body configuring the inductor 120, the plurality of magnetic layers 21 having the conductive patterns 41 may be stacked.

The magnetic body may be manufactured by printing the conductive patterns 41 on magnetic green sheets 21b to 21j, stacking the plurality of magnetic green sheets 21b to 21j having the conductive patterns 41 printed thereon, additionally stacking magnetic green sheets 21a and 21k thereon and therebelow, and then sintering the stacked magnetic green sheets.

The plurality of magnetic layers configuring the magnetic body may be in a sintered state, and adjacent magnetic layers are integrated with each other so that boundaries therebetween are not readily apparent without using a scanning electron microscope (SEM).

The magnetic layers may be formed using a Ni—Cu—Zn based ferrite material, a Ni—Cu—Zn—Mg based ferrite material, or a Mn—Zn based ferrite material, but are not limited thereto.

Referring to FIG. 2, the magnetic body may be formed by printing the conductive patterns 41 on the magnetic green sheets 21b to 21j and drying the same, and stacking the magnetic green sheets 21a and 21k thereon and therebelow.

A plurality of conductive patterns 41a to 41f may be stacked so that the conductive patterns 41 in the magnetic body form a coil pattern in the stacking direction.

The conductive patterns 41 may be formed by printing a conductive paste containing silver (Ag) as a main ingredient at a predetermined thickness.

The conductive patterns 41 may be formed on both end portions of the magnetic body in the length direction and electrically connected to third and fourth external electrodes 151b and 152b configuring input and output terminals 151 and 152, respectively.

The conductive patterns 41 may include leads electrically connected to the third and fourth external electrodes 151b and 152b configuring the input terminal 151 and the output terminal 152, respectively.

Referring to FIG. 2, one conductive pattern 41a among the conductive patterns 41 may be electrically connected to another conductive pattern 41b, through a via electrode formed in the magnetic layer 21 interposed therebetween, and they may form the coil pattern in the stacking direction.

According to the exemplary embodiment of the present disclosure, the coil pattern is not particularly limited, but may be designed in accordance with target inductance of the inductor.

That is, second to fifth conductive patterns 41b to 41e may be stacked while forming a coil shape between a first conductive pattern 41a having a lead exposed to the second end surface of the composite body and a sixth conductive pattern 41f having a lead exposed to the first end surface thereof, and the conductive patterns may be connected to each other through via electrodes formed in the magnetic layers as described above.

Although the number of respective second to fifth conductive patterns 41b to 41e is two as illustrated in FIG. 2, the present disclosure is not limited thereto, and the number is not limited according to the object of the present disclosure.

In addition, although the inductor 120 illustrated in FIG. 2 is a multilayer inductor, the present disclosure is not limited thereto, and the inductor may be a winding inductor or a thin film inductor.

The composite electronic component 100 according to the exemplary embodiment of the present disclosure may include the input terminal 151 formed on the first end surface of the composite body 130 and connected to the conductive pattern 41 of the inductor 120; the output terminal 152 including first output terminals 152a and 152b formed on the second end surface of the composite body 130 and connected to the conductive pattern 41 of the inductor 120 and a second output terminal 152c formed on any one or more of the upper and lower surfaces and the second side surface of the capacitor 110; and a ground terminal 153 formed on any one or more of the upper and lower surfaces and the first side surface of the capacitor 110 and connected to the internal electrodes of the capacitor 110.

The input terminal 151 and the first output terminal 152b may be connected to the conductive patterns of the inductor 120 to thereby serve as the inductor in the composite electronic component.

Further, the second output terminal 152c may be connected to the first internal electrodes 31 of the capacitor 110, and the second internal electrodes 32 of the capacitor 110 may be connected to the ground terminal 153 to thereby serve as the capacitor in the composite electronic component.

The input terminal 151, the output terminal 152, and the ground terminal 153 may be formed using a conductive paste containing a conductive metal.

The conductive metal may be nickel (Ni), copper (Cu), tin (Sn), or alloys thereof, but is not limited thereto.

The conductive paste may further contain an insulating material, wherein the insulating material may be, for example, glass, but is not limited thereto.

A method of forming the input terminal 151, the output terminal 152, and the ground terminal 153 is not particularly limited. That is, the input terminal 151, the output terminal 152, and the ground terminal 153 may be formed by dipping the ceramic body or may be formed by a plating method, or the like.

Figure 4:
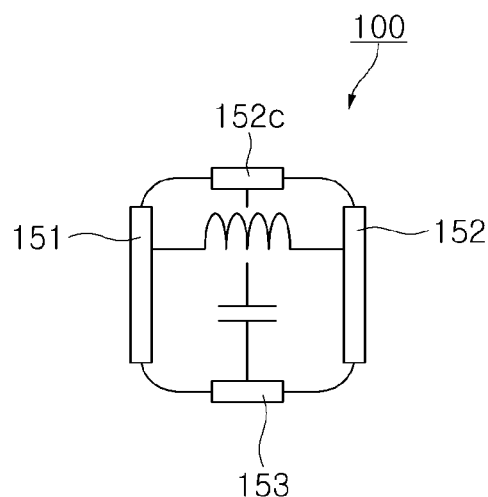
FIG. 4 is an equivalent circuit diagram of the composite electronic component illustrated in FIG. 1.

FIG. 4 is an equivalent circuit diagram of the composite electronic component illustrated in FIG. 1.

Referring to FIG. 4, unlike the related art, since the inductor 120 and the capacitor 110 are coupled to each other in the composite electronic component according to the exemplary embodiment of the present disclosure, a distance between the inductor 120 and the capacitor 110 may be designed to be set as a minimum distance, resulting in a decrease in noise.

In addition, since the inductor 120 and the capacitor 110 are coupled to each other, a mounting area in the PMIC may be significantly decreased, whereby the composite electronic component may be advantageous for securing a mounting space.

Further, at the time of mounting the composite electronic component, manufacturing costs may be decreased.

Meanwhile, a composite electronic component 100 according to another exemplary embodiment of the present disclosure may include: a composite body 130 having an overall hexahedral shape and including a capacitor 110 and an inductor 120 which are coupled to each other, the capacitor 110 being formed of a ceramic body in which a plurality of dielectric layers 11 and first and second internal electrodes 31 and 32 disposed to face each other with at least one of the dielectric layers 11 interposed therebetween are stacked, each first internal electrode 31 having a lead 31a exposed to a first side surface of the ceramic body and each second internal electrode 32 having a lead 32a exposed to a second side surface of the ceramic body, and the inductor 120 being formed of a magnetic body in which a plurality of magnetic layers 21 having conductive patterns 41 are stacked; a first external electrode 153 formed on the first side surface of the ceramic body and electrically connected to the first internal electrodes 31; a second external electrode 152c formed on the second side surface of the ceramic body and electrically connected to the second internal electrodes 32; first and second dummy electrodes 151a and 152a formed on first and second end surfaces of the ceramic body; and third and fourth external electrodes 151b and 152b formed on first and second end surfaces of the magnetic body and connected to the conductive patterns 41, wherein the composite body 130 includes an input terminal 151 formed by the connection between the first dummy electrode 151a and the third external electrode 151b, an output terminal 152 including a first output terminal formed by the connection between the second dummy electrode 152a and the fourth external electrode 152b and a second output terminal formed of the second external electrode 152c, and a ground terminal formed of the first external electrode 153.

The capacitor 110 may include the first external electrode 153 formed on the first side surface of the ceramic body and electrically connected to the first internal electrodes 31, the second external electrode 152c formed on the second side surface of the ceramic body and electrically connected to the second internal electrodes 32, and the first and second dummy electrodes 151a and 152a formed on the first and second end surfaces of the ceramic body.

The first external electrode 153 is formed on the first side surface of the ceramic body, and may be extended to upper and lower surfaces of the ceramic body.

The second external electrode 152c is formed on the second side surface of the ceramic body, and may be extended to the upper and lower surfaces of the ceramic body.

The first and second dummy electrodes 151a and 152a are formed on the first and second end surfaces of the ceramic body, respectively, and may be extended to the upper and lower surfaces and the first and second side surfaces of the ceramic body.

That is, the capacitor 110 included in the composite electronic component according to this exemplary embodiment of the present disclosure includes the first external electrode 153, the second external electrode 152c, and the first and second dummy electrodes 151a and 152a, thereby being configured as a four-terminal capacitor.

In addition, the inductor 120 may include the third and fourth external electrodes 151b and 152b formed on the first and second end surfaces of the magnetic body and connected to the conductive patterns 41.

The third and fourth external electrodes 151b and 152b are formed on the first and second end surfaces of the magnetic body, respectively, and may be extended to upper and lower surfaces and first and second side surfaces of the magnetic body.

The first dummy electrode 151a of the capacitor 110 and the third external electrode 151b of the inductor 120 may be connected to each other to form the input terminal 151 of the composite electronic component.

In addition, the second dummy electrode 152a of the capacitor 110 and the fourth external electrode 152b of the inductor 120 may be connected to each other to form the first output terminal of the composite electronic component, and the second external electrode 152c of the capacitor 110 may form the second output terminal of the composite electronic component, such that the output terminal 152 including the first and second output terminals may be formed.

Meanwhile, the first external electrode 153 of the capacitor 110 may be connected to an electrode pad on a board as a ground electrode to thereby form the ground terminal 153 of the composite electronic component.

The first dummy electrode 151a of the capacitor 110 and the third external electrode 151b of the inductor 120 forming the input terminal 151 may be connected to each other by a conductive adhesive, but the present disclosure is not limited thereto.

In addition, the second dummy electrode 152a of the capacitor 110 and the fourth external electrode 152b of the inductor 120 forming the first output terminal may be connected to each other by a conductive adhesive, but the present disclosure is not limited thereto.

Descriptions of features of the composite electronic component 100 according to this exemplary embodiment of the present disclosure overlapped with those of the composite electronic component according to the previous exemplary embodiment of the present disclosure will be omitted in order to avoid redundancy.

Figure 5:
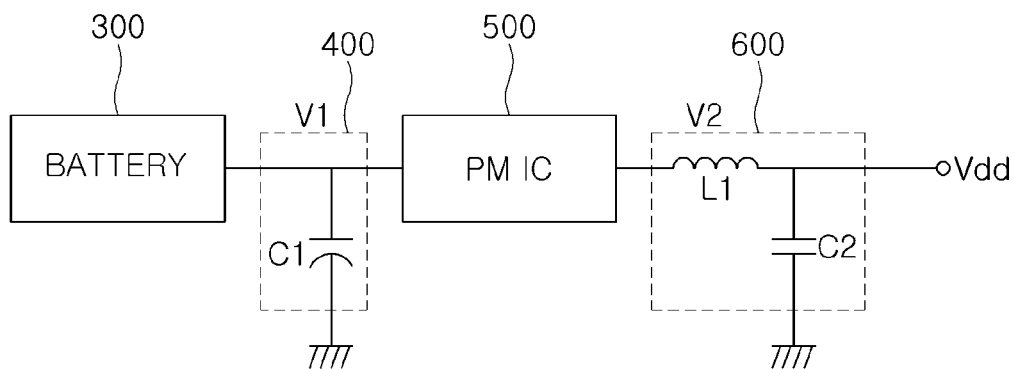
FIG. 5 is a diagram illustrating a driving power supply system supplying driving power to a predetermined terminal requiring driving power through a battery and a power management unit.

FIG. 5 is a diagram illustrating a driving power supply system supplying driving power to a predetermined terminal requiring driving power through a battery and a power management unit.

Referring to FIG. 5, the driving power supply system may include a battery 300, a first power stabilization unit 400, a power management unit 500, and a second power stabilization unit 600.

The battery 300 may supply power to the power management unit 500. Here, the power supplied to the power management unit 500 by the battery 300 is defined as first power.

The first power stabilization unit 400 may stabilize the first power $V_1$ and supply the stabilized first power to the power management unit. More specifically, the first power stabilization unit 400 may include a capacitor $C_1$ provided between a connection terminal of the battery 300 and the power management unit 500 and a ground. The capacitor $C_1$ may reduce noise included in the first power.

In addition, the capacitor $C_1$ may have electrical charges charged therein. Further, in the case in which the power management unit 500 instantly consumes a large amount of current, the capacitor $C_1$ may discharge the charged electrical charges to suppress voltage fluctuations in the power management unit 500.

The capacitor $C_1$ may be a high capacitance capacitor.

The power management unit 500 may serve to convert power supplied to an electronic device into power suitable for the electronic device, and distribute, charge, and control the power. Therefore, the power management unit 500 may generally include a DC/DC converter.

In addition, the power management unit 500 may be configured as a power management integrated circuit (PMIC).

The power management unit 500 may convert the first power $V_1$ into second power $V_2$. The second power $V_2$ may be power required by a predetermined device connected to an output terminal of the power management unit 500 and receiving driving power.

The second power stabilization unit 600 may stabilize the second power $V_2$ and supply the stabilized second power to an output terminal $V_{dd}$. The predetermined device receiving the driving power from the power management unit 500 may be connected to the output terminal $V_{dd}$.

More specifically, the second power stabilization unit 600 may include an inductor $L_1$ connected in series between the power management unit 500 and the output terminal $V_{dd}$. In addition, the second power stabilization unit 600 may include a capacitor $C_2$ formed between a connection terminal of the power management unit 500 and the output terminal $V_{dd}$ and the ground.

The second power stabilization unit 600 may reduce noise included in the second power $V_2$.

Further, the second power stabilization unit 600 may stably supply the power to the output terminal $V_{dd}$.

The inductor $L_1$ may be a power inductor to which a high level of current may be applied.

In addition, the capacitor $C_2$ may be a high capacitance capacitor.

Figure 6:
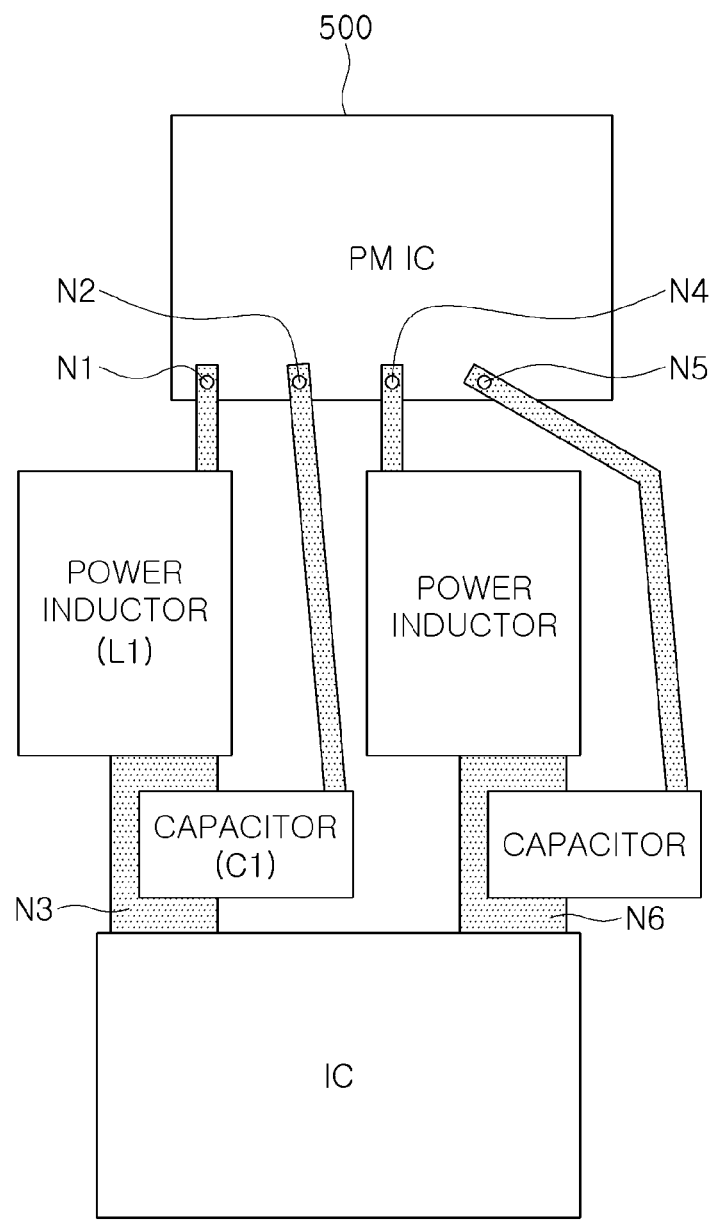
FIG. 6 is a diagram illustrating an arrangement pattern of the driving power supply system.

FIG. 6 is a diagram illustrating an arrangement pattern of the driving power supply system.

An arrangement pattern of the power management unit 500, the power inductor $L_1$, and the second capacitor $C_2$ may be understood with reference to FIG. 6.

Generally, the power management unit (PMIC) 500 may include several to several tens of DC/DC converters. Further, in order to implement a function of the DC/DC converter, a power inductor and a high capacitance capacitor may be required in each DC/DC converter.

Referring to FIG. 6, the power management unit 500 may include predetermined terminals N1 and N2. The power management unit 500 may receive power from the battery and convert the power using the DC/DC converters. In addition, the power management unit 500 may supply the converted power through the first terminal N1. The second terminal N2 may be a ground terminal.

Here, since the first power inductor $L_1$ and the second capacitor $C_2$ receive power from the first terminal N1 and stabilize the received power to supply driving power through a third terminal N3, the first power inductor $L_1$ and the second capacitor $C_2$ may perform functions of the second power stabilization unit.

Since fourth to sixth terminals N4 to N6 illustrated in FIG. 6 perform the same functions as those of the first to third terminals N1 to N3, a detailed description thereof will be omitted.

In designing the pattern of the driving power supply system, disposing the power management unit, the power inductor, and the high capacitance capacitor to be maximally close to each other is an important consideration. In addition, it is necessary for power line wirings to be relatively short and thick.

The reason for this is that a component arrangement area may be decreased only in the case in which the above-mentioned conditions are satisfied, and the generation of noise may be suppressed.

In the case in which the number of output terminals of the power management unit 500 is small, there is no problem in disposing the power inductor and the high capacitance capacitor to be close to each other. However, in the case in which various output terminals of the power management unit 500 need to be used, the power inductor and the high capacitance capacitor may not be normally arranged due to density of components. In addition, the power inductor and the high capacitance capacitor may inevitably be arranged in a non-optimal state according to the priority of power.

For example, since sizes of the power inductor and the high capacitance capacitor are relatively large, power lines and signal lines may be inevitably elongated at the time of arranging such components.

In the case in which the power inductor and the high capacitance capacitor are arranged in the non-optimal state, intervals between respective components and the power lines may become long, thereby generating noise. The noise may have a negative influence on the power supply system.

Figure 7:
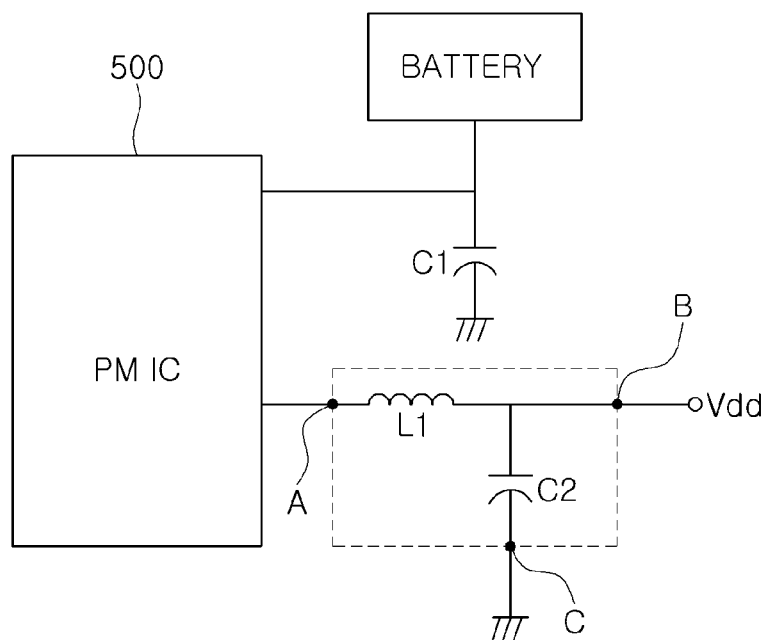
FIG. 7 is a circuit diagram of a composite electronic component according to an exemplary embodiment in the present disclosure.

FIG. 7 is a circuit diagram of a composite electronic component according to an exemplary embodiment of the present disclosure.

Referring to FIG. 7, a composite electronic component 700 may include an input terminal unit A (input terminal), a power stabilization unit, an output terminal unit B (output terminal), and a ground terminal unit C (ground terminal).

The power stabilization unit may include a power inductor $L_1$ and a second capacitor $C_2$.

The composite electronic component 700 may be capable of performing functions of the above-mentioned second power stabilization unit.

The input terminal unit A may be supplied with power converted by the power management unit 500.

The power stabilization unit may stabilize the power supplied from the input terminal unit A.

The output terminal unit B may supply the stabilized power to an output terminal $V_{dd}$.

The ground terminal unit C may connect the power stabilization unit to the ground.

Meanwhile, the power stabilization unit may include the power inductor $L_1$ connected between the input terminal unit A and the output terminal unit B and the second capacitor $C_2$ connected between the ground terminal unit C and the output terminal unit.

Referring to FIG. 7, the power inductor $L_1$ and the second capacitor $C_2$ share the output terminal unit B with each other, such that an interval between the power inductor $L_1$ and the second capacitor $C_2$ may be decreased.

As described above, the composite electronic component 700 may have the power inductor and the high capacitance capacitor provided in the output power terminal of the power management unit 500 configured as a single component. Therefore, the degree of integration of the components in the composite electronic component 700 may be improved.

Figure 8:
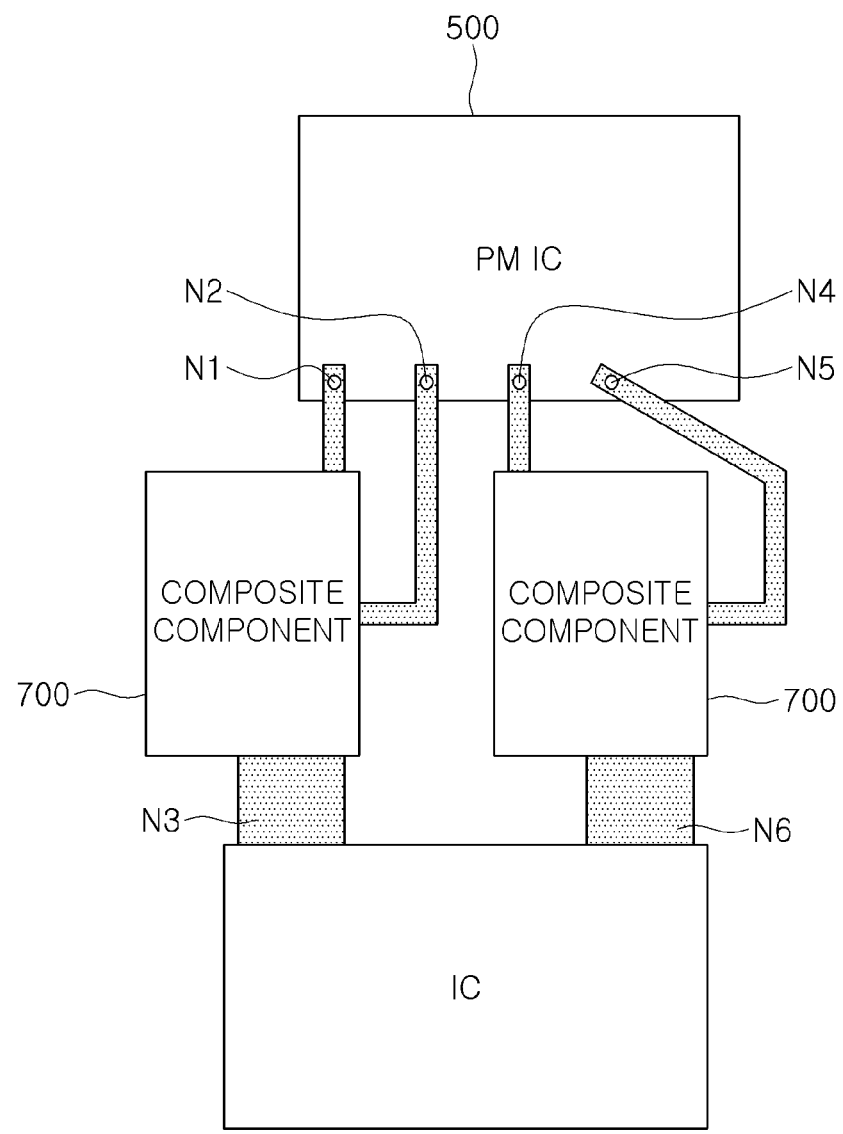
FIG. 8 is a diagram illustrating an arrangement pattern of a driving power supply system using a composite electronic component according to an exemplary embodiment in the present disclosure.

FIG. 8 is a diagram illustrating an arrangement pattern of a driving power supply system using a composite electronic component according to an exemplary embodiment of the present disclosure.

Referring to FIG. 8, it may be confirmed that the second capacitor $C_2$ and the power inductor $L_1$ illustrated in FIG. 6 are replaced with the composite electronic component according to the exemplary embodiment of the present disclosure.

As described above, the composite electronic component may perform the functions of the second power stabilization unit.

In addition, the second capacitor $C_2$ and the power inductor $L_1$ are replaced with the composite electronic component according to the exemplary embodiment of the present disclosure, such that a length of wiring may be significantly decreased. In addition, as the number of arranged components is decreased, the components may be optimally arranged.

That is, according to the exemplary embodiment of the present disclosure, the power management unit, the power inductor, and the high capacitance capacitor may be arranged to be maximally close to each other, and the power line wiring may be designed to be short and thick.

Meanwhile, in order to satisfy user requirements, electronic device manufacturers have made efforts to decrease the size of printed circuit boards (PCBs) included in electronic devices. Therefore, it is necessary to increase a degree of integration of an integrated circuit (IC) mounted in the PCB. This demand may be satisfied by configuring a plurality of components as a single composite component, similarly to the composite electronic component according to the exemplary embodiment of the present disclosure.

In addition, according to the exemplary embodiment of the present disclosure, two components (the second capacitor and the power inductor) are configured as a single composite electronic component, such that a mounting area at the time of being mounted on the PCB may be decreased. According to the exemplary embodiment of the present disclosure, the mounting area of the two components may be decreased by about 10% to 30%, as compared to existing arrangement patterns.

Further, according to the exemplary embodiment of the present disclosure, the power management unit 500 may supply the driving power to the IC through the shortest wiring route.

Board Having Composite Electronic Component

Figure 9:
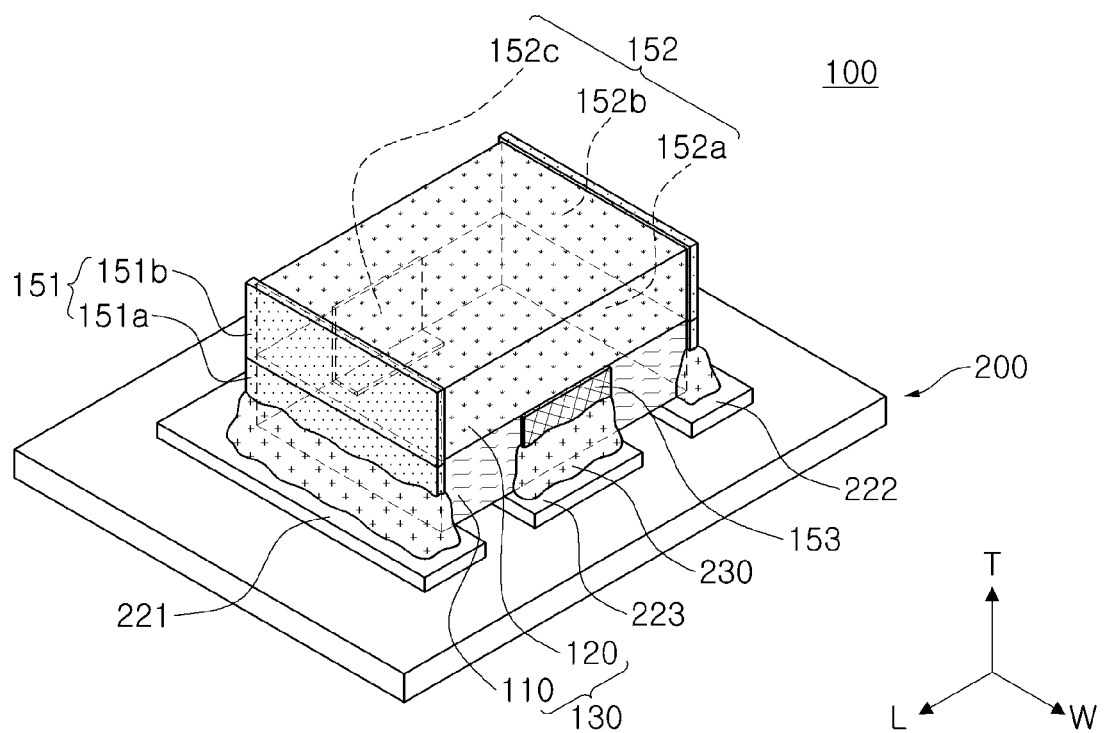
FIG. 9 is a perspective view illustrating the composite electronic component of FIG. 1 mounted on a printed circuit board.

FIG. 9 is a perspective view illustrating the composite electronic component of FIG. 1 mounted on a printed circuit board.

Figure 10:
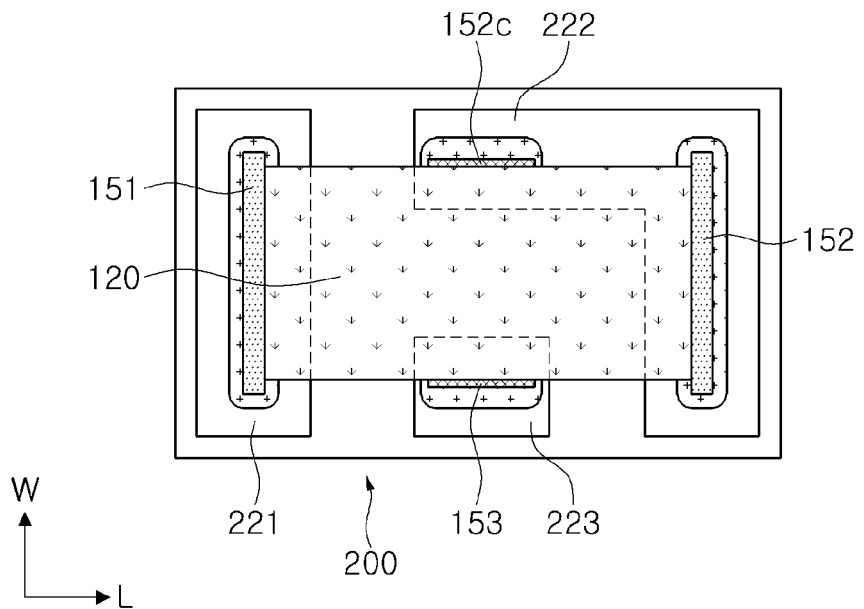
FIG. 10 is a plan view of FIG. 9.

FIG. 10 is a plan view of FIG. 9.

Figure 11:
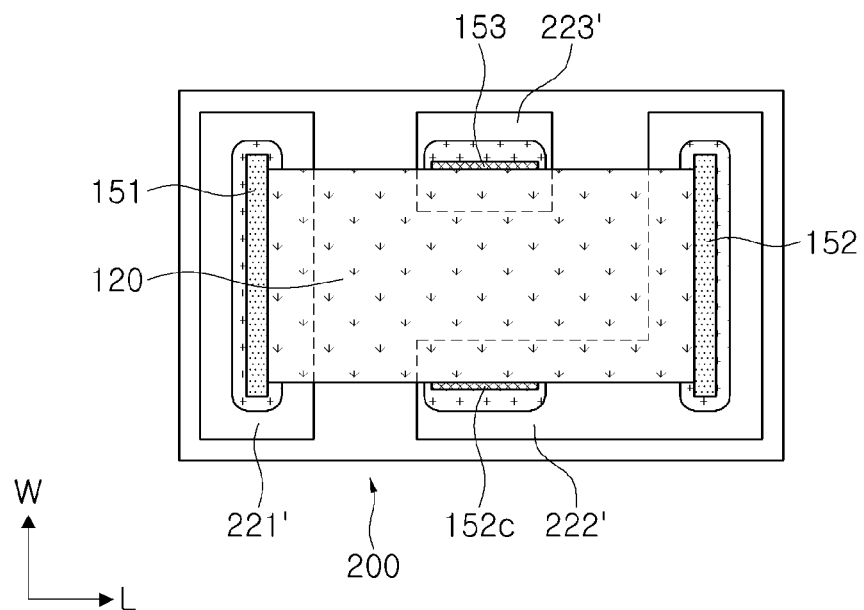
FIG. 11 is a plan view illustrating a modified example of FIG. 9 according to another exemplary embodiment in the present disclosure.

FIG. 11 is a plan view illustrating a modified example of FIG. 9 according to another exemplary embodiment of the present disclosure.

Figure 12:
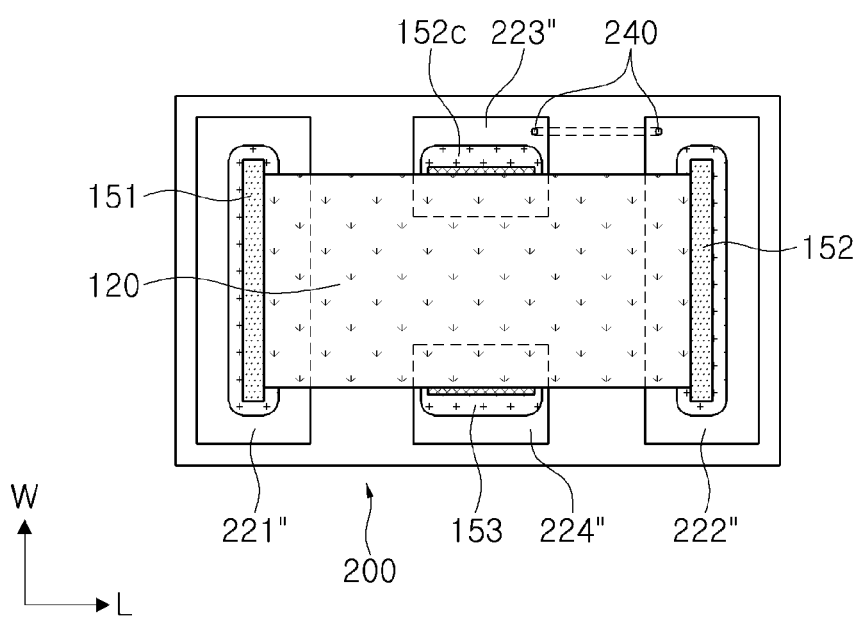
FIG. 12 is a plan view illustrating a modified example of FIG. 9 according to another exemplary embodiment in the present disclosure.

FIG. 12 is a plan view illustrating a modified example of FIG. 9 according to another exemplary embodiment of the present disclosure.

Referring to FIGS. 9 and 10, a board 200 having a composite electronic component 100 according to the present exemplary embodiment may include a printed circuit board 210 on which the composite electronic component 100 is mounted, and three or more electrode pads 221 to 223 formed on the printed circuit board 210.

The electrode pads may include first to third electrode pads 221 to 223 connected to the input terminal 151, the output terminal 152, and the ground terminal 153 of the composite electronic component, respectively.

In this case, the input terminal 151, the output terminal 152, and the ground terminal 153 of the composite electronic component 100 may be electrically connected to the printed circuit board 210 by solders 230 in a state in which they are positioned to contact the first to third electrode pads 221 to 223, respectively.

Particularly, referring to FIGS. 9 and 10, the output terminal 152 may include the first output terminals 152a and 152b and the second output terminal 152c, and the second electrode pad 222 in contact with the output terminal 152 may have a ']'-like shape.

Referring to FIG. 11, according to another exemplary embodiment of the present disclosure, the electrode pads may include first to third electrode pads 221' to 223' connected to the input terminal 151, the output terminal 152, and the ground terminal 153 of the composite electronic component 100, respectively.

According to this exemplary embodiment of the present disclosure, a shape of the second electrode pad 222' is symmetrical with regard to that of the second electrode pad 222 of the board for mounting of a composite electronic component according to the above-mentioned exemplary embodiment of the present disclosure.

Meanwhile, referring to FIG. 12, according to another exemplary embodiment of the present disclosure, the electrode pads may include a first electrode pad 221" connected to the input terminal 151 of the composite electronic component 100, a second electrode pad 222" connected to the first output terminal 152, a third electrode pad 223" connected to the second output terminal 152c, and a fourth electrode pad 224" connected to the ground terminal 153.

The second and third electrode pads 222" and 223" may be connected to each other through a via 240, but are not limited thereto.

As set forth above, according to exemplary embodiments of the present disclosure, a composite electronic component having a reduced component mounting area in a driving power supply system may be provided.

In addition, according to the exemplary embodiments of the present disclosure, the composite electronic component capable of suppressing the generation of noise may be provided.

While exemplary embodiments have been shown and described above, it will be apparent to those skilled in the art that modifications and variations could be made without departing from the spirit and scope of the present disclosure as defined by the appended claims.

What is claimed is:

1. A composite electronic component, comprising:
a composite body having a hexahedral shape and including a capacitor and an inductor which are coupled to each other, the capacitor having a ceramic body in which a plurality of dielectric layers and first and second internal electrodes disposed to face each other with at least one of the dielectric layers interposed therebetween are stacked, each first internal electrode having a lead exposed to a first side surface of the ceramic body and each second internal electrode having a lead exposed to a second side surface of the ceramic body, and the inductor having a magnetic body in which a plurality of magnetic layers having conductive patterns and lead portions extending from the conductive patterns are stacked;
a first external electrode disposed on the first side surface of the ceramic body and electrically connected to the first internal electrodes;
a second external electrode disposed on the second side surface of the ceramic body and electrically connected to the second internal electrodes;
first and second dummy electrodes disposed on first and second end surfaces of the ceramic body; and
third and fourth external electrodes disposed on first and second end surfaces of the magnetic body and connected to the conductive patterns through the lead portions,
wherein the composite body includes an input terminal having the first dummy electrode and the third external electrode which are connected to each other, an output terminal including a first output terminal having the second dummy electrode and the fourth external electrode which are connected to each other and a second output terminal having the second external electrode, and a ground terminal having the first external electrode,
wherein the inductor is disposed on the capacitor, and
wherein the second external electrode is disposed in a lower position than the lead portions of the conductive patterns.

2. The composite electronic component of claim 1, wherein the capacitor and the inductor are coupled to each other by a conductive adhesive.

3. The composite electronic component of claim 1, wherein the inductor is a winding inductor or a thin film inductor.

4. A board having a composite electronic component, the board comprising:
a printed circuit board on which three or more electrode pads are provided;
the composite electronic component of claim 1 mounted on the printed circuit board; and
solders connecting the electrode pads and the composite electronic component to each other.

5. The board of claim 4, wherein the electrode pads include:
a first electrode pad connected to the input terminal of the composite electronic component;
a second electrode pad connected to the first and second output terminals of the composite electronic component; and
a third electrode pad connected to the ground terminal of the composite electronic component.

6. The board of claim 4, wherein the electrode pads include:
a first electrode pad connected to the input terminal of the composite electronic component;

a second electrode pad connected to the first output terminal of the composite electronic component;

a third electrode pad connected to the second output terminal of the composite electronic component; and a fourth electrode pad connected to the ground terminal of the composite electronic component.

7. The board of claim 4, wherein the second and third electrode pads are connected to each other through a via.

8. The board of claim 4, wherein the inductor is a winding inductor or a thin film inductor.

9. A composite electronic component, comprising:

an input terminal receiving power converted by a power management unit;

a power stabilization unit stabilizing the power and including a composite body having a hexahedral shape and including a capacitor and an inductor which are coupled to each other, the capacitor having a ceramic body in which a plurality of dielectric layers and internal electrodes disposed to face each other with at least one of the dielectric layers interposed therebetween are stacked, and the inductor having a magnetic body in which a plurality of magnetic layers having conductive patterns and lead portions extending from the conductive patterns are stacked;

an output terminal supplying the stabilized power; and a ground terminal for grounding, wherein the inductor is disposed on the capacitor, wherein the output terminal includes a first output terminal disposed on a first end surface of the composite body and a second output terminal disposed on a first side surface of the composite body, and is connected to the conductive patterns of the inductor through the lead portions and the internal electrodes of the capacitor, and wherein the second output terminal is disposed in a lower position than the lead portions of the conductive patterns.

10. The composite electronic component of claim 9, wherein the input terminal is disposed on a second end surface of the composite body, and the ground terminal is disposed on a lower surface and a second side surface of the composite body and connected to the internal electrodes of the capacitor.

11. The composite electronic component of claim 9, wherein the internal electrodes include:

first internal electrodes each having a lead exposed to the first side surface of the composite body; and second internal electrodes each having a lead exposed to a second side surface of the composite body.

12. The composite electronic component of claim 11, wherein the input terminal has a first dummy electrode disposed on a second end surface of the ceramic body and a third external electrode disposed on a second end surface of the magnetic body and connected to the conductive pattern, the first dummy electrode and the third external electrode being connected to each other, the output terminal includes a first output terminal having a second dummy electrode disposed on a first end surface of the ceramic body and a fourth external electrode disposed on a first end surface of the magnetic body and connected to the conductive pattern, the second dummy electrode and the fourth external electrode being connected to each other, and a second output terminal having a second external electrode disposed on a first side surface of the ceramic body and electrically connected to the second internal electrodes, and the ground terminal has a first external electrode disposed on a second side surface of the ceramic body and electrically connected to the first internal electrodes.

13. The composite electronic component of claim 9, wherein the inductor is a winding inductor or a thin film inductor.

14. A board having a composite electronic component, the board comprising:

a printed circuit board on which three or more electrode pads are provided;

the composite electronic component of claim 9 mounted on the printed circuit board; and solders connecting the electrode pads and the composite electronic component to each other.

15. The board of claim 14, wherein the electrode pads include:

a first electrode pad connected to the input terminal of the composite electronic component;

a second electrode pad connected to the first and second output terminals of the composite electronic component; and a third electrode pad connected to the ground terminal of the composite electronic component.

16. The board of claim 14, wherein the electrode pads include:

a first electrode pad connected to the input terminal of the composite electronic component;

a second electrode pad connected to the first output terminal of the composite electronic component;

a third electrode pad connected to the second output terminal of the composite electronic component; and a fourth electrode pad connected to the ground terminal of the composite electronic component.

17. The board of claim 14, wherein the second and third electrode pads are connected to each other through a via.

18. The board of claim 14, wherein the inductor is a winding inductor or a thin film inductor.

* * * * *